United States Patent
Kim et al.

(10) Patent No.: US 7,499,370 B2
(45) Date of Patent: Mar. 3, 2009

(54) SYNCHRONOUS SEMICONDUCTOR MEMORY DEVICE

(75) Inventors: Hyun-jin Kim, Suwon-si (KR); Ho-young Song, Hwaseong-si (KR); Youn-sik Park, Yongin-si (KR); Seong-jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/850,754

(22) Filed: Sep. 6, 2007

(65) Prior Publication Data

US 2008/0056057 A1 Mar. 6, 2008

(30) Foreign Application Priority Data

Sep. 6, 2006 (KR) .................. 10-2006-0085882

(51) Int. Cl.
*G11C 8/00* (2006.01)
(52) U.S. Cl. .................. 365/233.1; 365/233; 365/193; 365/194; 365/189.01
(58) Field of Classification Search ............ 365/233.01, 365/233, 193, 194, 189.01
See application file for complete search history.

(56) References Cited

U.S. PATENT DOCUMENTS

| | | | | |
|---|---|---|---|---|
| 6,215,710 B1 * | 4/2001 | Han et al. | .................. | 365/193 |
| 7,184,340 B2 * | 2/2007 | Lim | .................. | 365/201 |
| 7,310,283 B2 * | 12/2007 | Hur et al. | .................. | 365/233.1 |

FOREIGN PATENT DOCUMENTS

| | | |
|---|---|---|
| JP | 2005004954 | 1/2005 |
| KR | 10-0521049 | 7/2005 |
| KR | 1020050115412 A | 7/2005 |
| KR | 1020050099773 A | 10/2005 |

* cited by examiner

*Primary Examiner*—Connie C Yoha
(74) *Attorney, Agent, or Firm*—Volentine & Whitt, PLLC

(57) ABSTRACT

A synchronous semiconductor memory device includes an output control signal generator, which generates an output control signal corresponding to a signal obtained by delaying a read information signal in response to a delay internal clock signal obtained by dividing an internal clock signal by n, first and second sampling signals obtained by delaying the internal clock signal, a first output control clock signal obtained by dividing the internal clock signal by n, and a column address strobe (CAS) latency signal. The synchronous semiconductor memory device also includes a data output buffer, which outputs data by buffering internal data in response to the output control signal and the first output control clock signal.

10 Claims, 4 Drawing Sheets

SYNCHRONOUS SEMICONDUCTOR MEMORY DEVICE

CROSS-REFERENCE TO RELATED PATENT APPLICATIONS

A claim of priority is made to Korean Patent Application No. 10-2006-0085882, filed on Sep. 6, 2006, the subject matter of which is incorporated herein by reference.

BACKGROUND OF THE INVENTION

1. Field of the Invention

The present disclosure relates generally to a semiconductor memory device and, more particularly, the present invention relates to a synchronous semiconductor memory device.

2. Description of the Related Art

Semiconductor memory devices form the bulk of memories used in computer systems. These memory devices usually include memory cells as the basic building blocks. In particular, data is input to these memory cells and data is output from these memory cells. The operating speeds of the computer systems depend on the speeds of the memory devices in the computer systems, which in turn depend on the speeds at which data are input to and output from these memory cells.

Various types of memory devices exist in the computer industry at this time. These types of devices include, for example, Dynamic Random Access Memory (DRAM) and Synchronous Dynamic Random Access Memory (SDRAM). SDRAM is generally considered to have higher operating speeds than DRAM. This is generally because, unlike DRAM, which is asynchronous, the SDRAM has a synchronous interface, meaning that it waits for a clock signal before responding to its control inputs. The clock is used to drive an internal finite state machine that pipelines incoming instructions. Because the instructions are pipelined, a SDRAM can receive a new instruction before completing a previous one.

Generally, a SDRAM uses column address strobe (CAS) latency to increase its operating frequency. CAS latency indicates the number of cycles of an external clock signal from when a read command is applied to a synchronous semiconductor memory device until data is output. The synchronous semiconductor memory device reads data stored therein in response to the read command and then outputs data after a number of clock cycles corresponding to the CAS latency. For example, when the CAS latency is 2, data is synchronized with an external clock signal 2 cycles after an external clock cycle in which a read command is applied. The read data is then output after the synchronization with the external clock signal.

Synchronization of the data with the external clock signal in a synchronous semiconductor memory device generally involves the use of a latency control circuit. In particular, a latency control circuit generates an output control signal, that is, a latency signal, in order to control data to be output from the synchronous semiconductor memory device after a predetermined number of cycles. In other words, the latency control circuit performs functions of an output control circuit. Specifically, after the read command is applied, the output control circuit provides the output control signal before a predetermined number of cycles of the output control clock signal in accordance with the CAS latency.

While the above-described operation of a synchronous semiconductor memory device increases operation speed, it includes various limitations. For example, as the operating frequency of the synchronous semiconductor memory device is increased, the sampling margin (or a timing margin) of an internal signal, such as a read information signal, in which a read command is decoded, is decreased. In addition, the sampling margin can be further decreased by process, voltage, and/or temperature variations or jitter in the synchronous semiconductor memory device.

This decrease of the sampling margin may affect the output control circuit, such that the output control circuit produces errors in the read data. As a result, the synchronous semiconductor memory device, including the output control circuit, may not output valid data.

SUMMARY OF THE INVENTION

An aspect of the present disclosure provides a synchronous semiconductor memory device. The device includes an output control signal generator which generates an output control signal corresponding to a signal obtained by delaying a read information signal in response to a delay internal clock signal obtained by dividing an internal clock signal by n (n being an even number equal to or greater than 2), first and second sampling signals obtained by delaying the internal clock signal, a first output control clock signal obtained by dividing the internal clock signal by n, and a column address strobe (CAS) latency signal. The synchronous semiconductor memory device also includes a data output buffer which outputs data by buffering internal data in response to the output control signal and the first output control clock signal.

The synchronous semiconductor memory device may further include a first control clock signal generator which generates the delay internal clock signal. The first control clock signal generator may include a first divider, which divides the internal clock signal by n, and a delay unit, which generates the delay internal clock signal in synchronization with the read information signal by delaying the internal clock signal divided by n.

The synchronous semiconductor memory device may further include a second control clock signal generator that generates the first and second sampling clock signals. The second control clock signal generator may include a delay locked loop circuit, which generates the first output control clock signal; a replica data output buffer, which generates a second output control clock signal by delaying the first output control clock signal for a time period corresponding to a time taken for the data output buffer to output the data; and a replica clock buffer, which generates a third output control clock signal by delaying the second output control clock signal for a time period corresponding to a delay time in a clock buffer that generates the internal clock signal. A second divider generates a fourth output control clock signal by dividing the third output control clock signal by n and provides the fourth output control clock signal to the delay locked loop circuit. A sampling signal generator generates a pre-sampling clock signal by delaying the internal clock signal. A replica delay unit delays the pre-sampling clock signal for a time period corresponding to a delay time in the delay unit. The replica delay unit also generates the first and second sampling clock signals in response to a rising edge and a falling edge of the delayed pre-sampling clock signal, respectively.

The output control signal generator may include a first input unit, which generates a first read information signal by sampling the read information signal in response to a rising edge of the delay internal clock signal, and a second input unit, which generates a second read information signal by sampling the read information signal in response to a falling edge of the delay internal clock signal. A first sampling unit samples the first read information signal in response to at least one of the first sampling clock signal and the CAS latency signal, and a second sampling unit samples the second read information signal in response to at least one of the second sampling clock signal and the CAS latency signal. A logic unit performs an OR operation with respect to output signals of the first and second sampling units. An output unit outputs an output signal of the logic unit as the output control signal in response to at least one of the first output control clock signal and the CAS latency signal.

Another aspect of the present disclosure provides a synchronous semiconductor memory device, which includes an output control signal generator for generating an output control signal corresponding to a signal obtained by delaying a sampling read signal in response to delay internal clock signal, a column address strobe (CAS) latency signal, multiple sampling clock signals, and a first output control clock signal. The synchronous semiconductor memory device also includes a sampling signal generator which generates a pre-sampling clock signal based on an internal clock signal, the sampling clock signals being generated based on the pre-sampling clock signal. The pre-sampling clock signal may be delayed for a predetermined time period with respect to the internal clock signal in response to the internal clock signal, an enable signal and a second output control clock signal based on the first output control clock signal.

The synchronous semiconductor memory device may further include a replica delay unit operatively connected to the output control signal generator and the sampling signal generator. The replica delay unit generates the sampling clock signals by delaying the pre-sampling clock signal for a predetermined time period. The replica delay unit may generate a first sampling clock signal of the multiple clock signals in synchronization with a rising edge of the delayed pre-sampling clock signal, and a second sampling clock signal in synchronization with a falling edge of the delayed pre-sampling clock signal.

BRIEF DESCRIPTION OF THE DRAWINGS

The embodiments of the present invention will be described with reference to the attached drawings, in which.

DETAILED DESCRIPTION OF THE EMBODIMENTS

Figure 1:
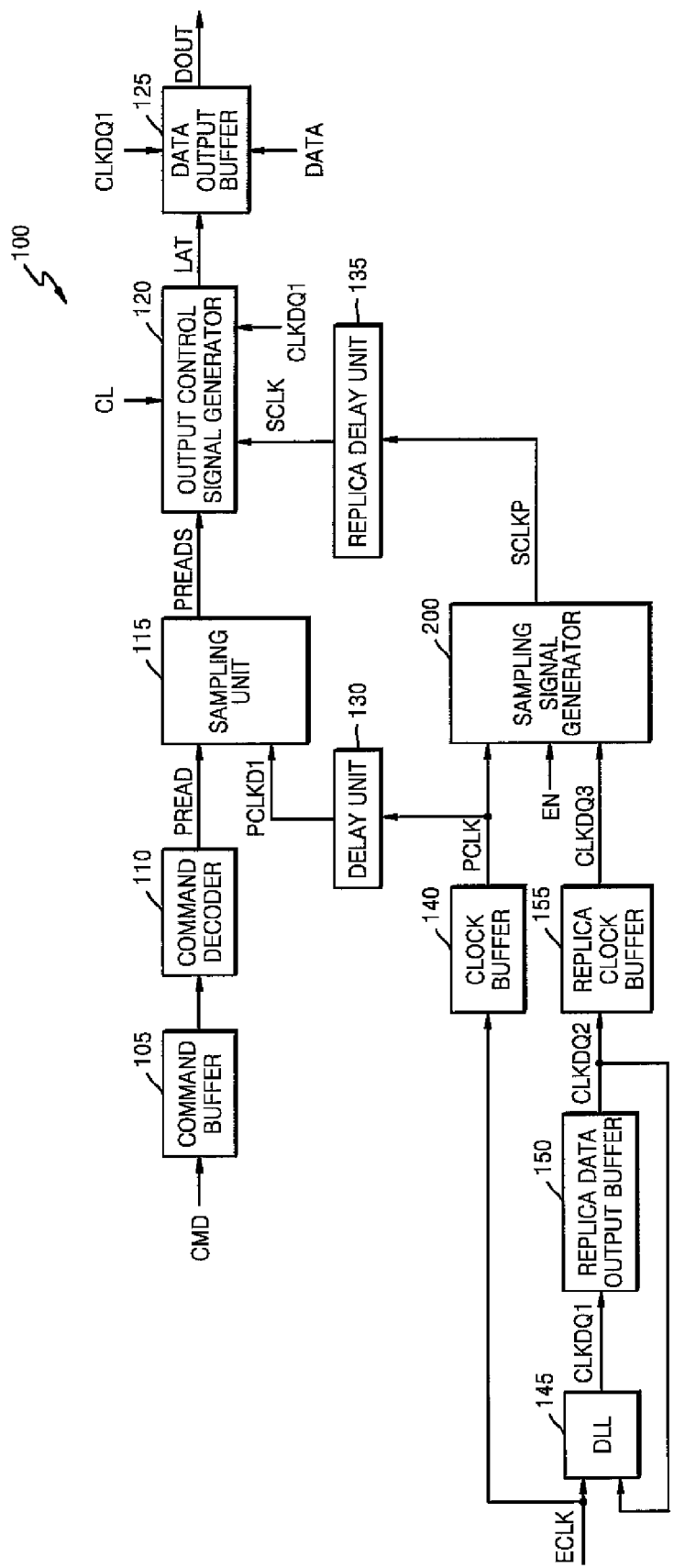
FIG. 1 is a block diagram of a synchronous semiconductor memory device, according to a comparative example of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

FIG. 1 is a block diagram of a synchronous semiconductor memory device 100, which is intended to provide a comparative example with respect to embodiments of the present invention, discussed below. Referring to FIG. 1, the synchronous semiconductor memory device 100 includes a command buffer 105, a command decoder 110, a sampling unit 115, an output control signal generator 120, a data output buffer 125, a delay unit 130, a replica delay unit 135, a clock buffer 140, a delay locked loop circuit (DLL) 145, a replica data output buffer 150, a replica clock buffer 155, and a sampling signal generator 200.

The command buffer 105 buffers a command signal CMD, which is applied from an external device to the synchronous semiconductor memory device 100, and provides the command signal CMD to the command decoder 110. The command decoder 110 generates a read information signal PREAD by decoding the buffered command signal CMD. The read information signal PREAD indicates an output section and is activated for a predetermined time period, for example, 2 cycles, of an internal clock signal PCLK.

The clock buffer 140 generates the internal clock signal PCLK by buffering an external clock signal ECLK. The delay unit 130 generates a delay internal clock signal PCLKD1 by delaying the internal clock signal PCLK for a predetermined delay time. The delay time is a time period tREAD taken for the read information signal PREAD to be generated from the command signal CMD by the command buffer 105 and/or the command decoder 110. The time period tREAD is required for synchronizing the read information signal PREAD with the internal clock signal PCLK.

The sampling unit 115 generates a sampling of the read signal PREADS by sampling the read information signal PREAD in response to the delay internal clock signal PCLKD1. The DLL 145 generates a first output control clock signal CLKDQ1, which has a phase leading the phase of the external clock signal ECLK. The phase of the first output control clock signal CLKDQ1 leads the phase of the external clock signal ECLK by a data output time tSAC. The data output time tSAC is a time period taken for the data output buffer 125 to output data DOUT. Accordingly, the DLL 145 synchronizes the data DOUT output from the data output buffer 125 with the external clock signal ECLK.

The replica data output buffer 150 generates a second output control clock signal CLKDQ2, which has a phase synchronized with (or the same as) the external clock signal ECLK, by delaying the first output control clock signal CLKDQ1 for the data output time tSAC. That is, the replica data output buffer 150 replicates a delay time of the first output control clock signal CLKDQ1 delayed in the data output buffer 125. The second output control clock signal CLKDQ2 is provided to the DLL 145.

The replica clock buffer 155 generates a third output control clock signal CLKDQ3, which has a phase synchronized with the internal clock signal PCLK, by delaying the second output control clock signal CLKDQ2 for a predetermined delay time. For example, the replica clock buffer 155 replicates a delay time of the external clock signal ECLK delayed in the clock buffer 140.

The sampling signal generator 200 generates a pre-sampling clock signal SCLKP. The pre-sampling clock signal SCLKP is delayed for a predetermined time period with respect to the internal clock signal PCLK in response to the internal clock signal PCLK, the third output control clock signal CLKDQ3, and an enable signal EN. That is, the sampling signal generator 200 changes a clock signal used to generate a pre-sampling clock signal SCLKP from the third output control clock signal CLKDQ3 to the internal clock signal PCLK. By using the internal clock signal PCLK instead of the third output control clock signal CLKDQ3 to generate the sampling clock signal SCLK, the sampling signal generator 200 may increase a sampling margin for when the sampling of the sampling read signal PREADS input to the output control signal generator 120 is performed, using the sampling clock signal SCLK. This is because the third output control clock signal CLKDQ3 can generate more jitter than the internal clock signal PCLK due to jitter of the DLL 145 or inaccuracy of a delay time in the replica data output buffer 150 and the replica clock buffer 155.

The replica delay unit 135 generates the sampling clock signal SCLK by delaying the pre-sampling clock signal SCLKP for a time period corresponding to the time period that is set in the delay unit 130.

The output control signal generator 120 generates an output control signal LAT corresponding to a signal obtained by delaying the sampling read signal PREADS for a time period in accordance with column address strobe (CAS) latency. In particular, the output control signal LAT is generated in response to a CAS latency signal CL, which indicates activation of the CAS latency, the sampling clock signal SCLK and the first output control clock signal CLKDQ1, where CAS latency may be 4. Examples of the output control signal generator 120 are disclosed in Japanese Patent Publication No. 2005-004954, the subject matter of which is incorporated herein by reference. Therefore, additional detailed description of the output control signal generator 120 will not be repeated.

The data output buffer 125 outputs the data DOUT by buffering internal data DATA in response to the output control signal LAT and the first output control clock signal CLKDQ1. The internal data DATA is output from a memory cell array (not shown).

Figure 2:
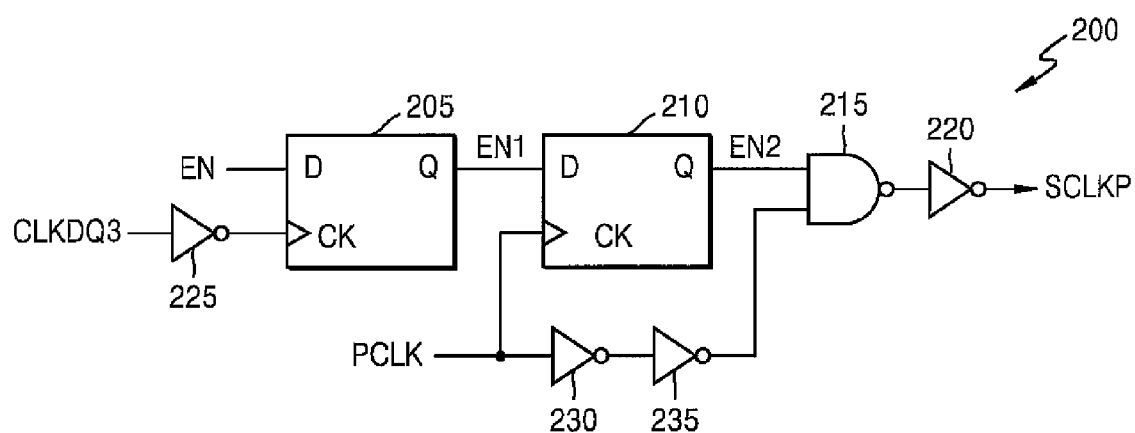
FIG. 2 is a circuit diagram illustrating a sampling signal generator of FIG. 1.

FIG. 2 is a circuit diagram illustrating the sampling signal generator 200 of FIG. 1 in detail. Referring to FIG. 2, the sampling signal generator 200 includes first and second D flip-flops 205 and 210, a NAND gate 215, and inverters 220, 225, 230 and 235.

The first D flip-flop 205 generates a first enable signal EN1 by sampling the enable signal EN in response to a signal obtained by inverting the third output control clock signal CLKDQ3. The enable signal EN is initially at a logic high level. The enable signal EN is reset to a logic low level when the first D flip-flop 205 is reset.

The second D flip-flop 210 generates a second enable signal EN2 by sampling the first enable signal EN1 in response to the internal clock signal PCLK. Furthermore, the NAND gate 215 performs a NAND operation with respect to the second enable signal EN2 and a signal obtained by delaying the internal clock signal PCLK through the inverters 230 and 235. An output delay time of the second D flip-flop 210 is almost identical to a delay time of the inverters 230 and 235. The inverter 220 generates the pre-sampling clock signal SCLKP by inverting an output signal of the NAND gate 215.

Referring back to FIG. 1, the synchronous semiconductor memory device 100 includes the sampling signal generator 200 in order to increase a sampling margin when sampling the sampling read signal PREADS using the sampling clock signal SCLK. However, because a delay path for generating the sampling clock signal SCLK is longer than the delay path for generating the delay internal clock signal PCLKD1, the delay path for generating the sampling clock signal SCLK may be affected by process, voltage and/or temperature variations. As a result, noise may occur in the sampling clock signal SCLK, thereby causing the phase of the sampling clock signal SCLK to lead or lag. Also, jitter may occur in the first output control clock signal CLKDQ1 due to the jitter of the DLL 145, thereby causing the phase of the first output control clock signal CLKDQ1 to lead or lag. Accordingly, a sampling margin in the output control signal generator 120 may be reduced.

Figure 3:
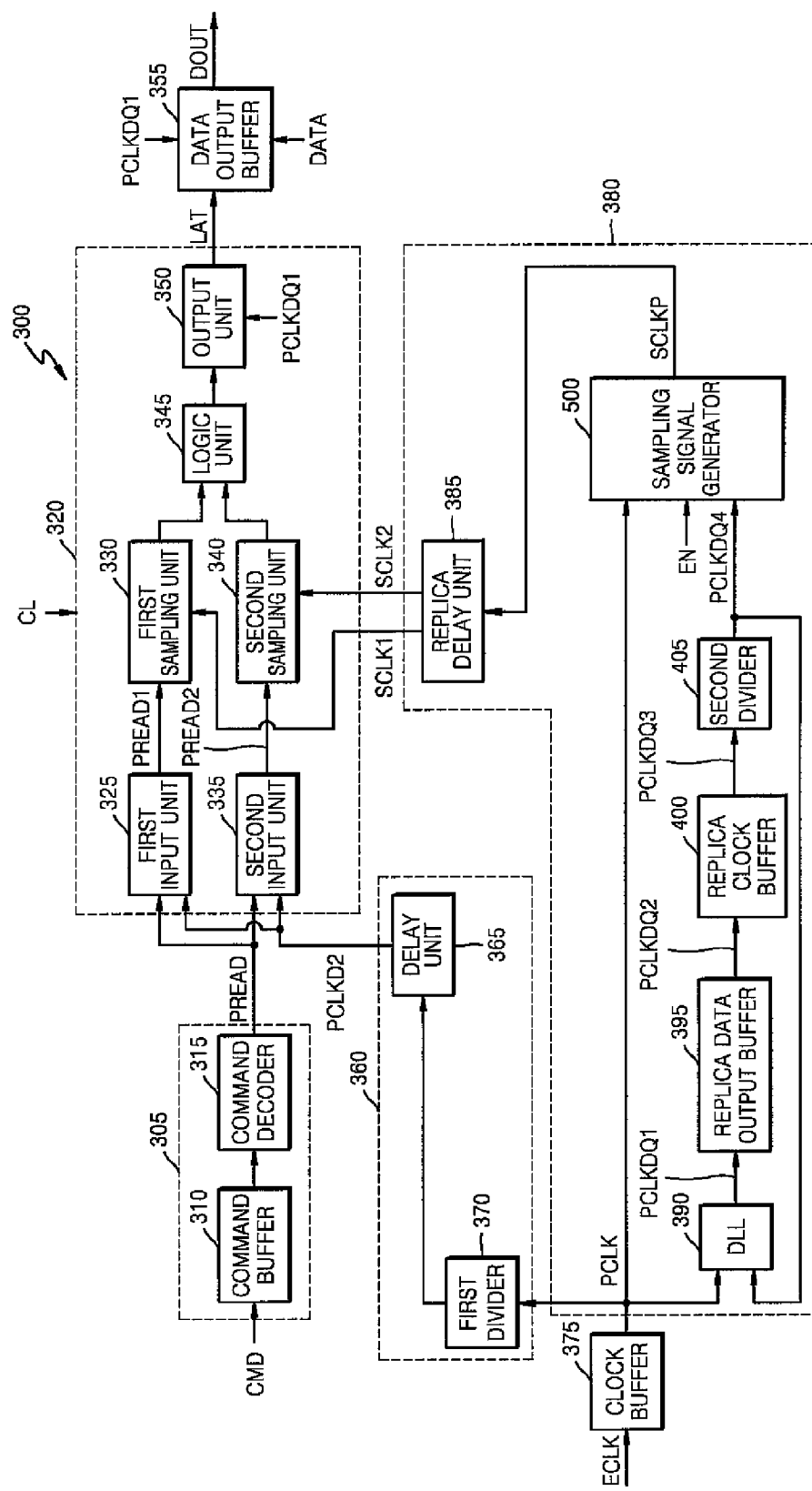
FIG. 3 is a block diagram of a synchronous semiconductor memory device, according to an exemplary embodiment of the present invention.

FIG. 3 is a block diagram of a synchronous semiconductor memory device 300 according to an exemplary embodiment of the present invention. Referring to FIG. 3, the synchronous semiconductor memory device 300 includes a read information output unit 305, an output control signal generator 320, a data output buffer 355, a first control clock signal generator 360, a clock buffer 375, and a second control clock signal generator 380.

The read information output unit 305 includes a command buffer 310 and a command decoder 315. The read information output unit 305 receives a command signal CMD and outputs a read information signal PREAD. The read information signal PREAD indicates an output section and is activated for a predetermined time period, for example, 2 cycles, of an internal clock signal PCLK.

The command buffer 310 buffers the command signal CMD, which is applied from an external device to the synchronous semiconductor memory device 300, and provides the command signal CMD to the command decoder 315. The command decoder 315 generates a read information signal PREAD by decoding the buffered command signal CMD.

The clock buffer 375 generates the internal clock signal PCLK by buffering an external clock signal ECLK. The internal clock signal PCLK is provided to the first and second control clock generators 360 and 380. It is beneficial to use the internal clock signal PCLK to generate the pre-sampling clock signal SCLKP, for example, to increase a sampling margin.

The first control clock signal generator 360 includes a first divider 370 and a delay unit 365. The first control clock signal generator 360 generates a delay internal clock signal PCLKD2 by dividing the internal clock signal PCLK by n and delaying the divided internal clock signal for a predetermined delay time period. In an exemplary embodiment, n is an even number equal to or greater than 2, and is increased as the CAS latency is increased.

A delay time in the first control clock signal generator 360 is a time period tREAD taken for the read information signal PREAD to be generated from the command signal CMD. The time period tREAD is required for synchronizing the read information signal PREAD with the internal clock signal PCLK.

The first divider 370 divides the internal clock signal PCLK by n and provides the divided internal clock signal to the delay unit 365. The delay unit 365 generates the delay internal clock signal PCLKD2 by delaying the divided internal clock signal for the time period tREAD.

The second control clock signal generator 380 includes a replica delay unit 385, a DLL 390, a replica data output buffer 395, a replica clock buffer 400, a second divider 405, and a sampling signal generator 500. The second control clock signal generator 380 generates first and second sampling clock signals SCLK1 and SCLK2 by delaying the internal clock signal PCLK.

The DLL 390 generates a first output control clock signal PCLKDQ1, which has a phase leading the phase of the external clock signal ECLK. The first output control clock signal PCLKDQ1 is a signal obtained by dividing the internal clock signal PCLK by n so as for control data DOUT to be output in synchronization with the external clock signal ECLK.

The phase of the first output control clock signal PCLKDQ1 leads the phase of the external clock signal ECLK by a data output time tSAC added to a delay time of the clock buffer 375 generated in the replica clock buffer 400. The data output time tSAC is a time period taken for the data output buffer 355 to output the data DOUT. Furthermore, a delay time of the replica clock buffer 400 compensates for a delay of the first output control clock signal PCLKDQ1 due to jitter of the DLL 390. Accordingly, the DLL 390 synchronizes the data DOUT output from the data output buffer 355 with the external clock signal ECLK.

The replica data output buffer 395 generates a second output control clock signal PCLKDQ2 by delaying the first output control clock signal PCLKDQ1 for the data output time tSAC. That is, the replica data output buffer 395 replicates a delay time of the first output control clock signal PCLKDQ1 delayed in the data output buffer 355.

The replica clock buffer 400 generates a third output control clock signal PCLKDQ3 by delaying the second output control clock signal PCLKDQ2. That is, the replica clock buffer 400 replicates a delay time of the external clock signal ECLK delayed in the clock buffer 375.

The second divider 405 generates a fourth output control clock signal PCLKDQ4, which has a phase synchronized with the internal clock signal PCLK, by dividing the third output control clock signal PCLKDQ3 by n. The fourth output control clock signal PCLKDQ4 is provided to the DLL 390.

The sampling signal generator 500 generates a pre-sampling clock signal SCLKP delayed for a predetermined time period with respect to the internal clock signal PCLK, in response to the internal clock signal PCLK, the fourth output control clock signal PCLKDQ4 and an enable signal EN. That is, the sampling signal generator 500 changes a clock signal, which generates the first and second sampling clock signals SCLK1 and SCLK2, from the fourth output control clock signal PCLKDQ4 to the internal clock signal PCLK. By using the internal clock signal PCLK instead of the fourth output control clock signal PCLKDQ4 to generate the pre-sampling clock signal SCLKP, the sampling signal generator 500 increases a sampling margin when the sampling of the read signal PREAD input to the output control signal generator 320 is performed, using the first and second sampling clock signals SCLK1 and SCLK2.

Because the fourth output control clock signal PCLKDQ4 may generate more jitter than the internal clock signal PCLK due to jitter of the DLL 390 or inaccuracy of a delay time in the replica data output buffer 395 and the replica clock buffer 400, the internal clock signal PCLK is used as the clock signal used to generate the first and second sampling clock signals SCLK1 and SCLK2.

The replica delay unit 385 delays the pre-sampling clock signal SCLKP for a time period corresponding to the time period that is set in the delay unit 365. Thus, the difference between the delay of the second output control clock signal PCLKDQ2 and the sampling clock signals SCLK1 and SCLK2 is reduced. Also, the replica delay unit 385 generates the first sampling clock signal SCLK1 in synchronization with a rising edge of the delayed pre-sampling clock signal and the second sampling clock signal SCLK2 in synchronization with a falling edge of the delayed pre-sampling clock signal.

The output control signal generator 320 includes a first input unit 325, a first sampling unit 330, a second input unit 335, a second sampling unit 340, a logic unit 345 and an output unit 350.

The output control signal generator 320 generates an output control signal LAT corresponding to a signal obtained by delaying the read signal PREAD, which indicates an output section of the data DOUT for a time period in accordance with the CAS latency, in response to the delay internal clock signal PCLKD2, the first and second sampling clock signals SCLK1 and SCLK2, the first output control clock signal PCLKDQ1 and a CAS latency signal CL which indicates activation of the CAS latency. In an exemplary embodiment, the CAS latency may be 4.

The first input unit 325 generates a first read information signal PREAD1 by sampling the read information signal PREAD in response to a rising edge of the delay internal clock signal PCLKD2.

The second input unit 335 generates a second read information signal PREAD2 in response to a falling edge of the delay internal clock signal PCLKD2. Furthermore, an active section of the first read information signal PREAD1 does not overlap the active section of the second read information signal PREAD2.

The first sampling unit 330 samples the first read information signal PREAD1 in response to the first sampling clock signal SCLK1 and the CAS latency signal CL, or in response to the first sampling clock signal SCLK1, and provides the sampled signal to the logic unit 345. The second sampling unit 340 samples the second read information signal PREAD2 in response to the second sampling clock signal SCLK2 and the CAS latency signal CL, or in response to the second sampling clock signal SCLK2, and provides the sampled signal to the logic unit 345.

The logic unit 345 performs an OR operation with respect to output signals of the first and second sampling units 330 and 340. Specifically, the logic unit 345 may include an OR gate to perform the OR operation.

The output unit 350 outputs an output signal of the logic unit 345 as the output control signal LAT in response to the first output control clock signal PCLKDQ1 or in response to the first output control clock signal PCLKDQ1 and the CAS latency signal CL.

As described above, the CAS latency signal CL can be selectively input to the first and second sampling units 330 and 340 and the output unit 350 in accordance with circuit configurations of the first and second sampling units 330 and 340 and a circuit configuration of the output unit 350. Because examples of circuit blocks corresponding to the first and second sampling units 330 and 340 and the output unit 350 are disclosed in Japanese Patent, Publication No. 2005-004954, the subject matter of which is incorporated herein by reference, detailed descriptions of the first and second sampling units 330 and 340 and the output unit 350 will not be repeated herein.

The data output buffer 355 outputs the data DOUT by buffering internal data DATA in response to the output control signal LAT and the first output control clock signal PCLKDQ1. The internal data DATA is output from a memory cell array (not shown).

By using the disclosed system, a period of a clock signal which samples an internal signal, i.e., a read information signal PREAD, in an output control signal generator can be increased in a synchronous semiconductor memory device. This increase in the period of the sampling clock signal may increase a sampling margin of the internal signal in the output control signal generator. An increase in the sampling margin may improve the latency control operation in a high frequency operation of a synchronous semiconductor memory device, such that the latency control operation may be performed stably in a high frequency operation.

Figure 4:
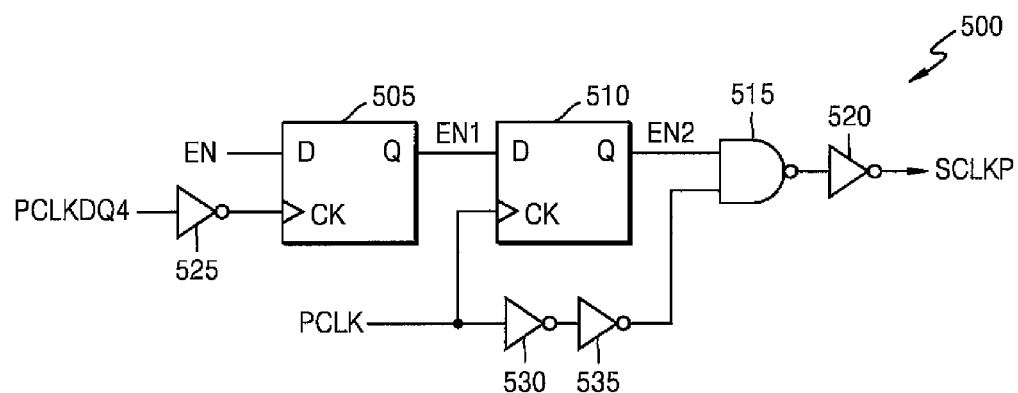
FIG. 4 is a circuit diagram illustrating a sampling signal generator of FIG. 3, according to an exemplary embodiment of the present invention.

FIG. 4 is a circuit diagram illustrating the sampling signal generator 500 of FIG. 3 in detail. Referring to FIG. 4, the sampling signal generator 500 includes first and second D flip-flops 505 and 510, a NAND gate 515, and inverters 520, 525, 530 and 535.

The first D flip-flop 505 generates a first enable signal EN1 by sampling the enable signal EN in response to a signal obtained by inverting the fourth output control clock signal PCLKDQ4. The enable signal EN is initially at a logic high level. The enable signal EN is reset to a logic low level when the first D flip-flop 505 is reset.

The second D flip-flop 510 generates a second enable signal EN2 by sampling the first enable signal EN1 in response to the internal clock signal PCLK. The NAND gate 515 performs a NAND operation with respect to the second enable signal EN2 and a signal obtained by delaying the internal clock signal PCLK through the inverters 530 and 535. An output delay time of the second D flip-flop 510 is almost identical to a delay time of the inverters 530 and 535. The inverter 520 generates the pre-sampling clock signal SCLKP by inverting an output signal of the NAND gate 515.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A synchronous semiconductor memory device, comprising:
   an output control signal generator which generates an output control signal corresponding to a signal obtained by delaying a read information signal in response to a delay internal clock signal obtained by dividing an internal clock signal by n (n being an even number equal to or greater than 2), first and second sampling clock signals obtained by delaying the internal clock signal, a first output control clock signal obtained by dividing the internal clock signal by n, and a column address strobe (CAS) latency signal; and
   a data output buffer which outputs data by buffering internal data in response to the output control signal and the first output control clock signal.

2. The synchronous semiconductor memory device of claim 1, further comprising:
   a first control clock signal generator which generates the delay internal clock signal, wherein the first control clock signal generator comprises:
      a first divider which divides the internal clock signal by n; and
      a delay unit which generates the delay internal clock signal in synchronization with the read information signal by delaying the internal clock signal divided by n.

3. The synchronous semiconductor memory device of claim 2, further comprising:
   a second control clock signal generator which generates the first and second sampling clock signals, wherein the second control clock signal generator comprises:
      a delay locked loop circuit which generates the first output control clock signal;
      a replica data output buffer which generates a second output control clock signal by delaying the first output control clock signal for a time period corresponding to a time taken for the data output buffer to output the data;
      a replica clock buffer which generates a third output control clock signal by delaying the second output control clock signal for a time period corresponding to a delay time in a clock buffer which generates the internal clock signal;
      a second divider which generates a fourth output control clock signal by dividing the third output control clock signal by n and which provides the fourth output control clock signal to the delay locked loop circuit;
      a sampling signal generator which generates a pre-sampling clock signal by delaying the internal clock signal; and
      a replica delay unit which delays the pre-sampling clock signal for a time period corresponding to a delay time in the delay unit and which generates the first and second sampling clock signals in response to a rising edge and a falling edge of the delayed pre-sampling clock signal, respectively.

4. The synchronous semiconductor memory device of claim 3, wherein the output control signal generator comprises:
   a first input unit which generates a first read information signal by sampling the read information signal in response to a rising edge of the delay internal clock signal;
   a second input unit which generates a second read information signal by sampling the read information signal in response to a falling edge of the delay internal clock signal;
   a first sampling unit which samples the first read information signal in response to at least one of the first sampling clock signal and the CAS latency signal;
   a second sampling unit which samples the second read information signal in response to at least one of the second sampling clock signal and the CAS latency signal;
   a logic unit which performs an OR operation with respect to output signals of the first and second sampling units; and
   an output unit which outputs an output signal of the logic unit as the output control signal in response to the first output control clock signal.

5. The synchronous semiconductor memory device of claim 3, wherein the output control signal generator comprises:
   a first input unit which generates a first read information signal by sampling the read information signal in response to a rising edge of the delay internal clock signal;
   a second input unit which generates a second read information signal by sampling the read information signal in response to a falling edge of the delay internal clock signal;
   a first sampling unit which samples the first read information signal in response to the first sampling clock signal;
   a second sampling unit which samples the second read information signal in response to the second sampling clock signal;
   a logic unit which performs an OR operation with respect to output signals of the first and second sampling units; and
   an output unit which outputs an output signal of the logic unit as the output control signal in response to the first output control clock signal and the CAS latency signal.

6. The synchronous semiconductor memory device of claim 3, wherein the output control signal generator comprises:

a first input unit which generates a first read information signal by sampling the read information signal in response to a rising edge of the delay internal clock signal;

a second input unit which generates a second read information signal by sampling the read information signal in response to a falling edge of the delay internal clock signal;

a first sampling unit which samples the first read information signal in response to the first sampling clock signal and the CAS latency signal;

a second sampling unit which samples the second read information signal in response to the second sampling clock signal and the CAS latency signal;

a logic unit which performs an OR operation with respect to output signals of the first and second sampling units; and an output unit which outputs an output signal of the logic unit as the output control signal in response to the first output control clock signal and the CAS latency signal.

7. A synchronous semiconductor memory device comprising:

an output control signal generator for generating an output control signal corresponding to a signal obtained by delaying a sampling read signal in response to delay internal clock signal, a column address strobe (CAS) latency signal, a plurality of sampling clock signals, and a first output control clock signal; and a sampling signal generator which generates a pre-sampling clock signal based on an internal clock signal, the plurality of sampling clock signals being generated based on the pre-sampling clock signal.

8. The semiconductor memory device of claim 7, wherein the pre-sampling clock signal is delayed for a predetermined time period with respect to the internal clock signal in response to the internal clock signal, an enable signal and a second output control clock signal based on the first output control clock signal.

9. The semiconductor memory device of claim 7, further comprising:

a replica delay unit operatively connected to the output control signal generator and the sampling signal generator, the replica delay unit generating the plurality of sampling clock signals by delaying the pre-sampling clock signal for a pre-determined time period.

10. The semiconductor memory device of claim 9, wherein the replica delay unit generates a first sampling clock signal of the plurality of sampling clock signals in synchronization with a rising edge of the delayed pre-sampling clock signal, and a second sampling clock signal of the plurality of sampling clock signals in synchronization with a falling edge of the delayed pre-sampling clock signal.

* * * * *